(12) United States Patent
Song

(10) Patent No.: US 7,715,229 B2
(45) Date of Patent: May 11, 2010

(54) MEMORY DEVICE

(75) Inventor: Aimin Song, Stockport (GB)

(73) Assignee: Nano EPrint Limited, Manchester (GB)

( * ) Notice: Subject to any disclaimer, the term of this patent is extended or adjusted under 35 U.S.C. 154(b) by 166 days.

(21) Appl. No.: 11/632,412

(22) PCT Filed: Jul. 14, 2005

(86) PCT No.: PCT/GB2005/002756

§ 371 (c)(1),
(2), (4) Date: Nov. 30, 2007

(87) PCT Pub. No.: WO2006/008467

PCT Pub. Date: Jan. 26, 2006

(65) Prior Publication Data

US 2008/0130356 A1 Jun. 5, 2008

(30) Foreign Application Priority Data

Jul. 16, 2004 (GB) ................................ 0415995.0

(51) Int. Cl.
*G11C 11/36* (2006.01)
(52) U.S. Cl. .................. 365/175; 365/189.011; 365/189.14; 365/189.15; 365/189.16
(58) Field of Classification Search ................. 365/175, 365/189.011, 189.14, 189.15, 189.16
See application file for complete search history.

(56) References Cited

U.S. PATENT DOCUMENTS 5,023,674 A 6/1991 Hikosaka et al.
5,596,522 A * 1/1997 Ovshinsky et al. .......... 365/113
7,113,420 B2 * 9/2006 Krieger et al. .............. 365/151
2002/0041519 A1 * 4/2002 Ahn et al. .............. 365/185.29
2002/0151172 A1 * 10/2002 Ahn et al. .................... 438/675

FOREIGN PATENT DOCUMENTS

| JP | 10-022500 | 1/1998 |
| WO | WO-02/086973 | 10/2002 |
| WO | WO-03/088366 | 10/2003 |

OTHER PUBLICATIONS

International Search Report dated Nov. 7, 2005, directed to counterpart PCT Application No. PCT/GB2005/002756.
Song et al. (Sep. 1, 2003). "Unidirectional electron flow in a nanometer-scale semiconductor channel: A self-switching device," *Applied Physics Letters* 83(9):1881-1883.
Song et al. (2005). "Nanometer-scale two-terminal semiconductor memory operating at room temperature," *Applied Physics Letters* 86:042106-1-042106-3.

* cited by examiner

*Primary Examiner*—Thong Q Le
(74) *Attorney, Agent, or Firm*—Morrison & Foerster LLP

(57) ABSTRACT

A memory device includes a memory unit comprising a substrate supporting mobile charge carriers. Insulative features formed on the substrate surface define first and second substrate areas on either side of the insulative features areas being connected by an elongate channel defined by the insulative features. The memory unit is switchable between first and second states in which the channel respectively provides a first conductance and a second, different conductance between the first and second areas at a predetermined potential difference between said first and second. A write circuit is arranged to apply a first potential difference across the first and second areas for changing the memory unit to the first state, and a second, different potential difference for changing the memory unit to the second state. A read circuit is arranged to apply the predetermined potential difference across the first and second areas for reading the state.

16 Claims, 8 Drawing Sheets

$V > +V_{th}$

MEMORY DEVICE

BACKGROUND OF THE INVENTION

The present invention relates to a memory device, to methods and apparatus for writing to and reading from the memory, and to associated methods of manufacture. Particularly embodiments of the present invention are suitable for, but not limited to, use as a memory for a computer.

A memory is a device used to store information for subsequent retrieval. The memory may be associated with a computer, or a device including a computational unit e.g. a mobile phone. Information is typically stored in digital form as sequences of bits.

Memory devices can be permanently connected to computational devices, or can be separate devices (e.g. secure digital flash memory) arranged to be removably connected to computational devices. Memory devices are now incorporated within a range of media e.g. many banking cards now incorporate a memory device, for storage of the PIN (personal identification number) of the user, on the card.

There is an ongoing desire within the electronics industry for miniaturisation of electronic/electrical circuits, including memory devices. Known techniques for making integrated circuits of micrometer dimensions commonly involve multiple steps comprising overlying and aligning different shapes and patterns (e.g. photolithographic techniques), with subsequent diffusion and implantation steps. However, miniaturisation of such steps (to manufacture devices of sub-micrometer dimensions e.g. nanometre dimensions) is problematic for a number of reasons, including the precise alignment of the apparatus required between each of the different steps. This leads to a relatively large increase in cost of the fabrication equipment utilised to manufacture such miniaturised devices.

Additionally, as semiconductor device dimensions rapidly reduce to the nanometre scale, physical phenomena arise that can have undesirable effects upon the operation of the miniaturised conventional semiconductor devices. For example, a single-electron transistor (SET) has been found to be extremely sensitive to fluctuating background charges. A single charged impurity in the close vicinity of a SET can seriously influence its operation. Thus, the performance of existing electronic devices can deteriorate, upon miniaturisation, unless a high degree of control of surface physical and chemical properties can be realised.

It is an aim of embodiments of the present invention to address one or more problems of the prior art, whether referred to herein or otherwise. It is an aim of particular embodiments of the present invention to provide a memory device that is relatively simple (and hence cheap) to manufacture.

SUMMARY OF THE INVENTION

According to a first aspect of the present invention there is provided a memory device comprising: at least one memory unit comprising a substrate supporting mobile charge carriers, insulative features formed on the substrate surface to define first and second substrate areas on either side of the insulative features, the first and second substrate areas being connected by an elongate channel defined by the insulative features, the memory unit being switchable between a first state in which the channel provides a first conductance between the first and second areas at a predetermined potential difference between said first and second areas, and a second state in which the channel provides a second, different conductance between the first and second areas at the predetermined potential difference; a write circuit arranged to apply a first potential difference across the first and second areas of said memory unit, for changing the memory unit to the first state, and a second, different potential difference for changing the memory unit to the second state; and a read circuit arranged to apply the predetermined potential difference across the first and second areas of said memory unit, for reading the state of the memory unit.

The memory unit of such a device is relatively simple to manufacture, as the memory unit can utilise a single pattern of features to define the functionality of the unit. Thus, the device can be manufactured using a relatively simple technique compared with prior art processes of fabricating integrated circuits, which involve multiple steps involving overlying and aligning different shapes and patterns. Additionally, the memory unit is typically relatively small e.g. the unit can be of sub-micrometer dimensions, without deleteriously affecting the memory performance.

Preferably, the predetermined potential difference is greater than one of the first and second potential differences, and less than the other.

The second potential difference may have the same magnitude, but be of the opposite polarity, to the first potential difference.

Preferably, the read circuit comprises a current sensor for measuring the current flow between the first and second areas of said memory unit.

Preferably, the device comprises a refresh circuit arranged to determine the state of said memory unit by applying the predetermined potential difference across the first and second areas of said memory unit, and arranged to subsequently apply the first potential difference if said memory unit is determined as being in the first state, and the second potential difference if the memory unit is determined as being in the second state.

The memory unit may be a self-switching diode.

The device may comprise a plurality of said memory units.

The read circuit may be arranged to apply the predetermined potential difference across the respective first and second areas of a plurality of said memory units, for reading the state of more than one memory unit simultaneously.

Preferably the plurality of memory units are arranged in a plurality of rows and a plurality of columns to form a memory array, with a first area of each memory unit being connected to a respective row line and second area of each memory unit being connected to a respective column line; the write circuit being arranged to apply a first voltage to the relevant column line and a second voltage to the relevant row line so as to provide at least one of said first potential difference and said second potential difference, which first and second voltages are insufficient to alter the state of the remaining memory units in the array.

The read circuit may be arranged to apply a sense voltage to one of the column lines, to apply a different, fixed voltage to the remaining column lines and to read the state of at least one memory unit using a current sense amplifier connected to the row line connected to that memory unit.

Said at least one memory unit may be arranged for removable connection to the write circuit and the read circuit.

According to a second aspect of the present invention there is provide a method of manufacturing a memory device, comprising; providing at least one memory unit comprising a substrate supporting mobile charge carriers, insulative features formed on the substrate surface to define first and second substrate areas on either side of the insulative features, the first and second substrate areas being connected by an elongate channel defined by the insulative features, the memory unit being switchable between a first state in which the channel provides a first conductance between the first and second areas at a predetermined potential difference between said first and second areas, and a second state in which the channel provides a second, different conductance between the first and second areas at the predetermined potential difference; providing a write circuit arranged to apply a first potential difference across the first and second areas of said memory unit, for changing the memory unit to the first state, and a second, different potential difference for changing the memory unit to the second state; and providing a read circuit arranged to apply the predetermined potential difference across the first and second areas of said memory unit, for reading the state of the memory unit.

According to a third aspect of the present invention there is provided a method of writing to a memory unit comprising a substrate supporting mobile charge carriers, insulative features formed on the substrate surface to define first and second substrate areas on either side of the insulative features, the first and second substrate areas being connected by an elongate channel defined by the insulative features, the memory unit being switchable between a first state in which the channel provides a first conductance between the first and second areas at a predetermined potential difference between said first and second areas, and a second state in which the channel provides a second, different conductance between the first and second areas at the predetermined potential difference; the method comprising at least one of: applying a first potential difference between the first and second areas of the memory unit, for changing the memory unit to the first state; and applying a second, different potential difference across the first and second areas of the memory unit, for changing the memory unit to the second state.

According to a fourth aspect of the present invention there is provided a method of reading a memory unit comprising a substrate supporting mobile charge carriers, insulative features formed on the substrate surface to define first and second substrate areas on either side of the insulative features, the first and second substrate areas being connected by an elongate channel defined by the insulative features, the memory unit being switchable between a first state in which the channel provides a first conductance between the first and second areas at a predetermined potential difference between said first and second areas, and a second state in which the channel provides a second, different conductance between the first and second areas at the predetermined potential difference; the method comprising: applying the predetermined potential difference across the first and second areas; and reading the state of the memory unit.

Preferably the state of the memory unit is read by measuring a signal indicative of the current flow between the first and second areas of the memory unit.

According to a fifth aspect of the present invention there is provided a scanning device comprising a voltage source, and electrodes for applying a potential difference between first and second areas of a memory unit, the scanning device being arranged to perform the method of at least one of claim 13 and claim 14.

BRIEF DESCRIPTION OF THE DRAWINGS

Embodiments of the invention will now be described, by way of example only, with reference to the accompanying drawings, in which.

DETAILED DESCRIPTION OF THE INVENTION

Figure 1:
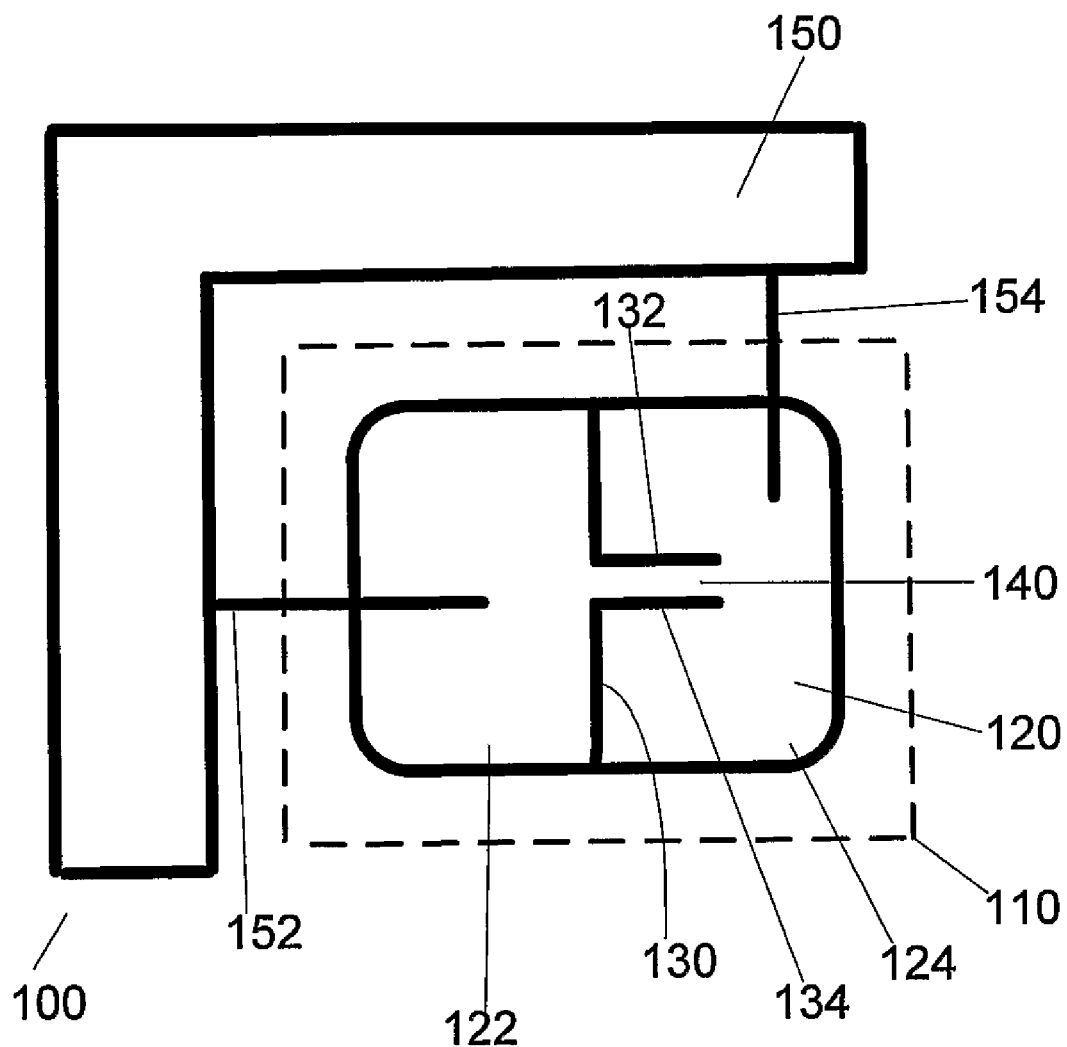
FIG. 1 is a schematic diagram of a memory device in accordance with an embodiment of the present invention.

FIG. 1 shows a nanometre-scale memory device 100 in accordance with an embodiment of the present invention. The device 100 comprises a memory unit 110 comprising a substrate 120 supporting mobile charge carriers (e.g. electrons or holes). Insulative features 130, 132, 134 are formed on the substrate surface to define first and second substrate areas 122, 124 on either side of the insulative features 130, 132, 134. The insulative features 132, 134 define a channel 140 connecting the first substrate area 122 to the second substrate area 124. The elongate channel 140 provides a charge carrier flow path from the first area to the second area. The insulative features extend to the edges of the device surface.

The elongate channel 140 is dimensioned such that the parameters of the charge carrier flow path are dependent on the potential difference between the first and second areas 122, 124. A first electrode 152 is coupled to the first area 122 for providing a voltage to that area. A second electrode 154 is coupled to the second area 124, for applying a voltage to the second area. The electrodes 152, 154 are coupled to a memory-scanning device 150. The scanning device 150 can include a read circuit for reading information from the memory device, or a write circuit for writing information to the memory device. In this particular embodiment, the scanning device 150 includes both a read circuit and a write circuit. The scanning device 150 is coupled to the memory unit 110 via the respective electrodes 152, 154. The scanning device 150 includes a voltage source, for generating the voltages to be applied to the respective first and second areas 122, 124. The read circuit includes a current sensor, for determining the current flow between the electrodes 152, 154.

The scanning circuit is arranged to apply a first potential difference across electrodes 152, 154 to switch the memory unit to a first state, and to apply a second potential difference across electrodes 152, 154 to switch the memory unit to a second, different state. The read circuit is arranged to apply a predetermined potential difference across the first and second areas of the memory unit (i.e. across the first and second electrodes 152, 154), and to subsequently measure the current flow between the electrodes at the predetermined voltage. The conductivity of the memory unit 110 is different for the different states, at the predetermined read potential difference. Thus, measuring the current flow between the electrodes at the predetermined read potential difference allows the determination of the state of the memory unit.

In this particular embodiment, the insulative features are grooves (trenches) in the surface of the substrate. The grooves can be readily formed by etching the surface of the substrate. The mobile charge carriers are electrons, provided in the form of a two-dimensional electron gas (2DEG). The 2DEG is formed as a layer a predetermined distance (e.g. 40 nm) beneath the surface of the substrate. The grooves extend through the layer of the 2DEG. The channel length is typically approximately one micron long. The width of the channel, as defined by the insulative features, is typically between one third and one quarter of the channel length i.e. the channel width is typically sub-micron.

The function of the memory unit utilises the high surface-to-volume ratio of the relatively narrow semiconductor channel 140. The memory unit is based on the self-switching diode (SSD, also termed self-switching device), described in International Patent Application "Nanoelectronic devices and circuits" published as WO 02/086973, and also reported in the article by A. M. Song et al., Applied Physics Letters 83, 1881 (2003). Both the International Patent Application and the published article are incorporated herein by reference.

These documents describe how diode-like current-voltage characteristics were realised by tailoring the boundary of a narrow semiconductor channel to break its symmetry. Unlike in a diode, neither a doping junction nor a tunneling barrier is required in an SSD to achieve the non-linear property of a diode.

The present inventor has determined an interesting and unexpected effect in the characteristics of such SSDs, namely that the SSD exhibits voltage-current characteristics having a degree of hysteresis. Further, the present inventor has realised that by appropriate driving of an SSD, a memory unit (or a memory array, incorporating an array of such units) can be realised.

Figure 2:
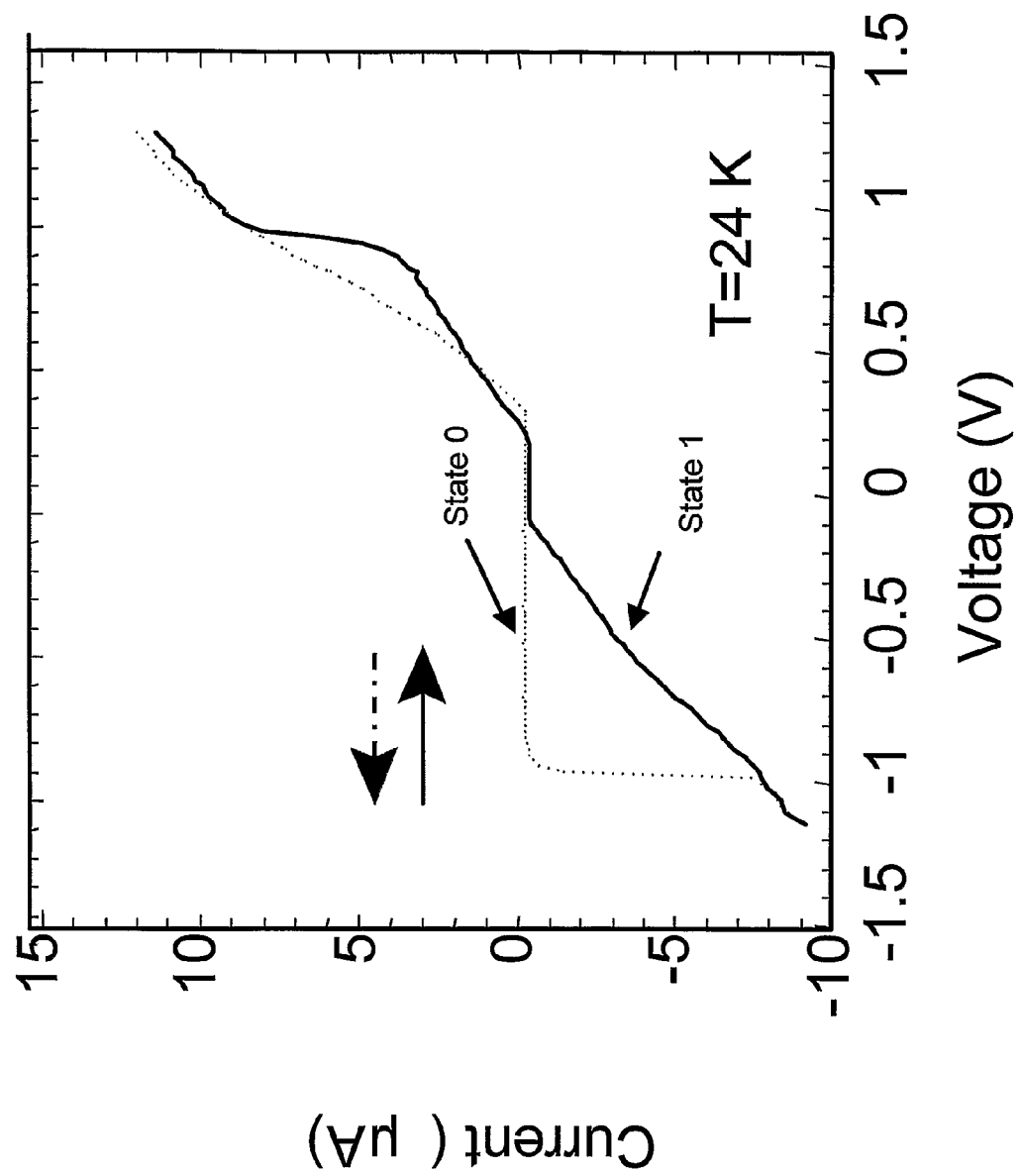
FIG. 2 is a graph of experimental current-voltage characteristics of a memory unit.

FIG. 2 shows the hysteresis of the voltage-current characteristics of a typical SSD, utilised as a memory unit. The article "Nanometre-scale two-terminal semiconductor memory operating at room temperature" by A. M. Song et al, Applied Physics Letters 86, 042106 (2005) also describes the operation of such a memory unit, the contents of which are incorporated herein by reference.

FIG. 2 shows the voltage-current characteristics of a typical memory unit, as measured at a temperature of 24 Kelvin. The dotted line of FIG. 2 illustrates the behaviour of the memory unit as the potential difference across the two substrate areas 122, 124 is decreased to a first lower threshold voltage (e.g. a first potential difference), of approximately one volt. It will be observed that the current flow through the memory unit increases sharply (i.e. a current breakdown occurs), once the potential difference applied across the two substrate areas is beneath a value of approximately −0.9V. The lower threshold voltage is less than the voltage at which the breakdown occurs.

The solid line indicates the behaviour as the potential difference between the two areas 122, 124 is increased from the lower threshold voltage, to beyond a higher, second threshold voltage (e.g. a second potential difference) of approximately 1 Volt. The second threshold voltage is the point at which the dotted and solid lines intersect, and is of approximately the same magnitude (but of the opposite sign or polarity) to the first threshold voltage. It will be observed that the solid curve displays a larger conductance, particularly in the reverse bias condition. If however, the applied voltage is reduced from the second threshold value (e.g. of +1V), the memory unit characteristics would then follow the dotted curve.

The present inventor has realised that this can be utilised to switch the memory unit between two states (labelled as State 0 and State 1 in FIG. 2) i.e. perform a write operation. The memory unit can be written to the first state (State 0) by applying a predetermined first potential difference across the two substrate areas of a voltage greater than the second threshold value (e.g. +1V). The memory unit can be written to the second state (State 1) by applying a predetermined second potential difference across the two substrate areas of a voltage less than the first threshold value (e.g. −1V). In the first state (State 0), the memory unit has negligible conductance at approximately −0.5V, and a higher conductance (approximately −3 microamps) when in the second state (State 1).

The state of the memory unit can then be read (a read operation performed) by applying a predetermined potential difference (the read potential or voltage) between the two threshold values (e.g. of −0.5 Volts), and determining the conductance of or current flow though the unit at that voltage. Other methods may however be utilised to determine the memory state e.g. the charge distribution within the memory unit (which is understood to determine the conductance of the channel) could be measured, to determine the memory state.

Although the graph of FIG. 2 was obtained at a relatively low operational temperature, the hysteresis effect (i.e. the memory effect) is still observed at higher temperatures, e.g. room temperature (300 K). Typically, the conductance of the channel is higher at room temperature. In one example memory unit, the memory state 0 did not correspond to zero conductance (current) at room temperature, but instead to a current of approximately 15-20 nA. However, the magnitude of the conductance of the memory unit in state 1 was still significantly higher e.g. approximately 45 nA.

It should be noted that the actual voltages applied to each electrode of the memory unit (i.e. to each area of the memory unit) is not significant, but it is the potential difference between the electrodes that is utilised to switch the unit between the different states, and to read the state of the memory unit. For example, a potential difference of −1V can be achieved by applying a voltage of +12V to the first electrode 152, and a voltage of +11V to the second electrode 154.

Although the above description describes the memory unit as having one memory state (state 0) corresponding to the device having a small (or negligible) conductance, and another state (state 1) as having a higher magnitude of conductance at the same predetermined applied potential difference, it will be appreciated that the designations of the states as state 0 and state 1 is purely for convenience. Either state may be utilised to indicate the memory unit as being at "state 0" (e.g. a first state), with the other state (e.g. state 2) then indicating the memory unit as being at "state 1".

Equally, although in FIG. 2 the memory unit is illustrated as being switchable between the two states by voltages of +1V and −1V, the actual potential differences required to write the memory unit to the different states can be varied, by varying the dimensions of the channel 140 between the two substrate areas.

Such a memory unit has a number of advantages over a conventional memory unit, such as a semiconductor dynamic access memory (DRAM), i.e. the memory currently used in many computers. Each memory unit requires only two terminals (electrodes), for addressing the memory unit (an SDRAM has three terminals). Further, the device operates well at sub-micrometer dimensions, and the memory unit structure is planar. Thus, the memory arrays of such memory units can be formed with a high integration density. Moreover, as will be illustrated below, the manufacture of such memory devices can be achieved by only one step of high-resolution lithography. This is much simpler than in the production of SDRAMs, where multiple-step high-resolution alignments are necessary. The production cost can therefore be much lower.

Memory devices often contain a refresh circuit, arranged to perform a refresh operation at periodic intervals. A refresh operation is a read operation (to determine the state of the memory), followed by a write operation (to write determined state back to that memory). Refresh operations are required due to memories having limited memory holding times.

Experiments have shown that the memory holding time (the length of time for which the memory recognisably stays in a single state) for the memory units described herein, is much longer than SDRAM. The typically memory holding time for SDRAM is of the order of milliseconds. However, the memory holding state at 24K for one memory unit was determined as being over 24 hours, whilst the memory holding state at 300K was found to be of the order of minutes. Such memory units as described herein can thus operate at relatively low refresh intervals compared with conventional devices, thus reducing the power consumption of the device. Further, in some applications, the memory unit can potentially be operated without a refresh circuit (e.g. if storage of a state for a relatively limited time period is required).

Optimisation of the material composition, device design, side wall coating and surface treatment could significantly increase this charge retention time. For instance, materials with a larger surface depletion depth can be used. Further, the trenches can be filled with materials with deeper (in energy) surface states.

The detailed structure of a typical memory unit will now be described, with reference to FIGS. 3A-3D.

Figure 3A:
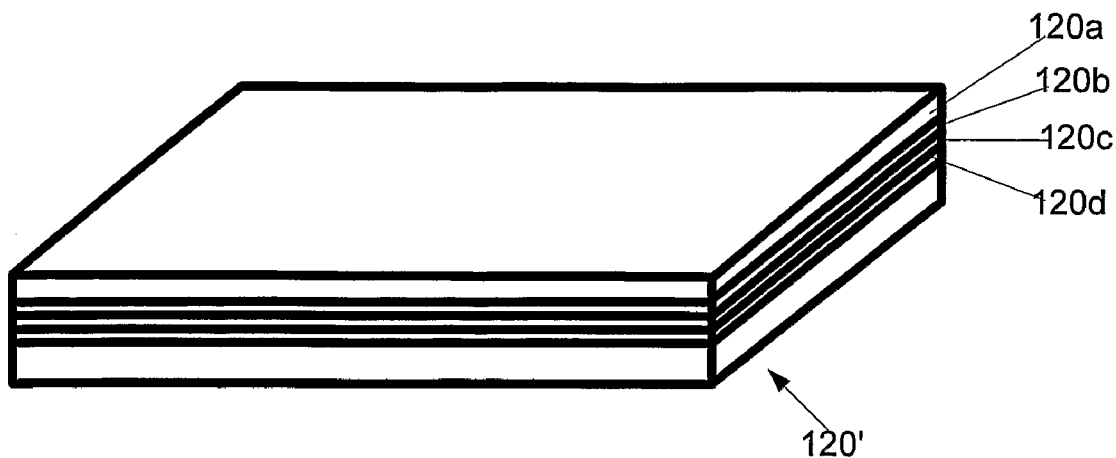
FIG. 3A is a perspective view showing the layer structure of a memory unit, prior to etching of channels.

FIG. 3A shows a typical semiconductor layer structure that can be utilised to form a memory unit. A range of semiconductors can be utilised to form the layer structure, including InGaAs/InAlAs (Indium Gallium Arsenide/Indium Aluminium Arsenide) or InGaAs/InP (Indium Gallium Arsenide/Indium Phosphide). The substrate of the memory unit is typically formed as a wafer with a quantum well. The heterostructure contains a two-dimensional electron gas (2DEG) in the quantum well. The wafer can be grown by metalorganic vapour phase epitaxy. Conventional Si, Ge, or Si/Ge material systems, with or without a 2DEG, can also be used.

FIG. 3A illustrates a typical wafer 120'. The wafer 120' is a modulation-doped $In_{0.75}Ga_{0.25}As/InP$ quantum-well wafer. The wafer 120' utilised to form the substrate 120 of the memory unit 110 can be envisaged as being formed of at least four discrete layers 120a, 120b, 120c, 120d. The two layers 120a, 120b are formed of undoped InP, the layers being separated by impurities (i.e. dopants).

The third layer 120c is formed of undoped GaInAs. Typically, this third layer is approximately 9 nm thick. The third layer provides the quantum well for the two-dimensional electron gas.

The fourth layer is another layer of undoped InP. Thus, the layer utilised to form the quantum-well is sandwiched between two layers (120b, 120d) of another semiconductor. The upper two layers 120a, 120b define the depth of the quantum well beneath the surface of the substrate of the memory unit. Typically, each of the other layers 120a, 120b is 20 nm thick i.e. the quantum well containing the two dimensional electron gas is formed approximately 40 nm beneath the substrate surface. Typically, the sheet carrier density and mobility at a temperature of 4.2K are $4.5\times10^{15}$ $m^{-2}$ and 45 $m^2/Vs$, respectively. At room temperature, the figures are $4.7\times10^{15}$ $m^{-2}$ and 1.2 $m^2/Vs$, respectively.

Figure 3B:
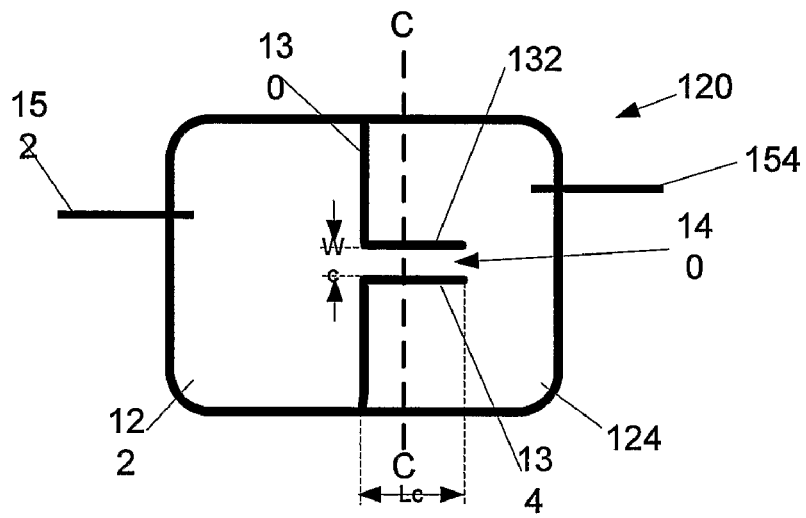
FIG. 3B is a plan view of the structure of FIG. 3A, with the channels etched.
Figure 3C:
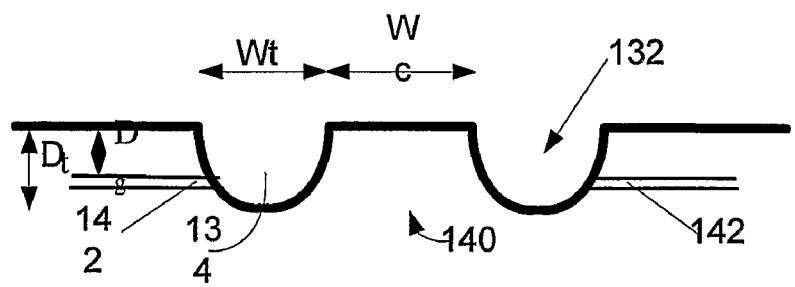
FIG. 3C is a cross-sectional view through the structure of FIG. 3B, illustrating the position of the 2 DEG (two-dimensional electron gas)

FIGS. 3B and 3C show respectively a plan view, and a cross-sectional view along the line CC in FIG. 3B, of a memory unit 120.

Once the wafer 120' is formed, the insulative features (e.g. the insulating grooves 130, 132, 134) are then formed on the surface. The grooves 130, 132, 134 can be formed using a single step of nanolithography. The grooves 130, 132, 134 are etched through the two-dimensional electron gas layer 142.

The grooves act to separate the upper surface of the substrate 120 into two areas 122, 124. The two areas 122, 124 are connected by a channel 140 extending between, and defined by, the grooves 132, 134.

It should be noted that the grooves 130 extend to the edges of the upper surface of the memory unit 120, so as to separate the upper surface into two discrete areas 122, 124, with the channel 140 providing the current flow path between the two surface areas 122, 124.

The channel 144 is of width Wc and length Lc. The grooves or trenches are of width Wt, and extend to a depth of $D_t$ beneath the surface of the substrate. The two-dimensional electron gas is a depth $D_g$ beneath the surface of the substrate. $D_t$ is greater than $D_g$. Typically, $D_g$ is between 30 nm and 50 nm. Typically, the 2DEG is between 5 nm and 10 nm thick. The channel width Wc is preferably between 10 nm and 50 nm. The groove width Wt is preferably between 10 nm and 300 nm. Preferably, the channel length Lc is 3 to 4 times the channel width Wt i.e. preferably Lc is between 30 nm and 1.2 μm. Preferably, to enhance the hysteresis effect, the grooves (trenches) 130, 132, 134, and the channel 140 are relatively narrow.

It should be understood that in the particular configuration shown with respect to FIGS. 3A-3C of the memory unit 120 is provided by way of example only. Different materials may be utilised to form the depletion layers. As the memory unit operation does not rely on ballistic electron transport, it is understood that memory units can also be produced using silicon materials e.g. by advanced complementary metal oxide semiconductor (CMOS) technologies. The different layers can be of any desired thickness.

In FIG. 3C the profile of the grooves or trenches is shown as being curved, in close approximation to a semi-circle. However, the groove profile can be any shape. For example, the groove profile can be V-shaped, or can extend from a relatively narrow neck adjacent the upper surface of the substrate of the memory unit, to a wider base portion.

The device performance may be improved by deposition of suitable materials into the trenches/grooves 130, 132, 134 that define the insulative features of the memory unit 120. Suitable materials for deposition in the trenches include $SiO_2$ and silicon nitride.

The grooves 130, 132, 134 are shown as being in a particular configuration in FIG. 3B. However, it should be understood that this configuration is provided by way of example only. Although the grooves 132, 134 are illustrated as being parallel, with each groove extending along a respective straight line, it should be understood that other geometrical configurations are possible. For example, the grooves 132, 134 may define a tapered channel (as opposed to the elongate channel of uniform width illustrated in FIG. 3B). The taper may be towards, or away from, the second area 124. Alternatively, the grooves (i.e. insulative features) may define a channel that varies in width along the channel length from a first width W1, to a second width W2, to a third width W3. W2 may be greater than both W1 and W3, or W2 may be less than both W1 and W3. W1 and W3 may be equal, or different.

Figure 4:
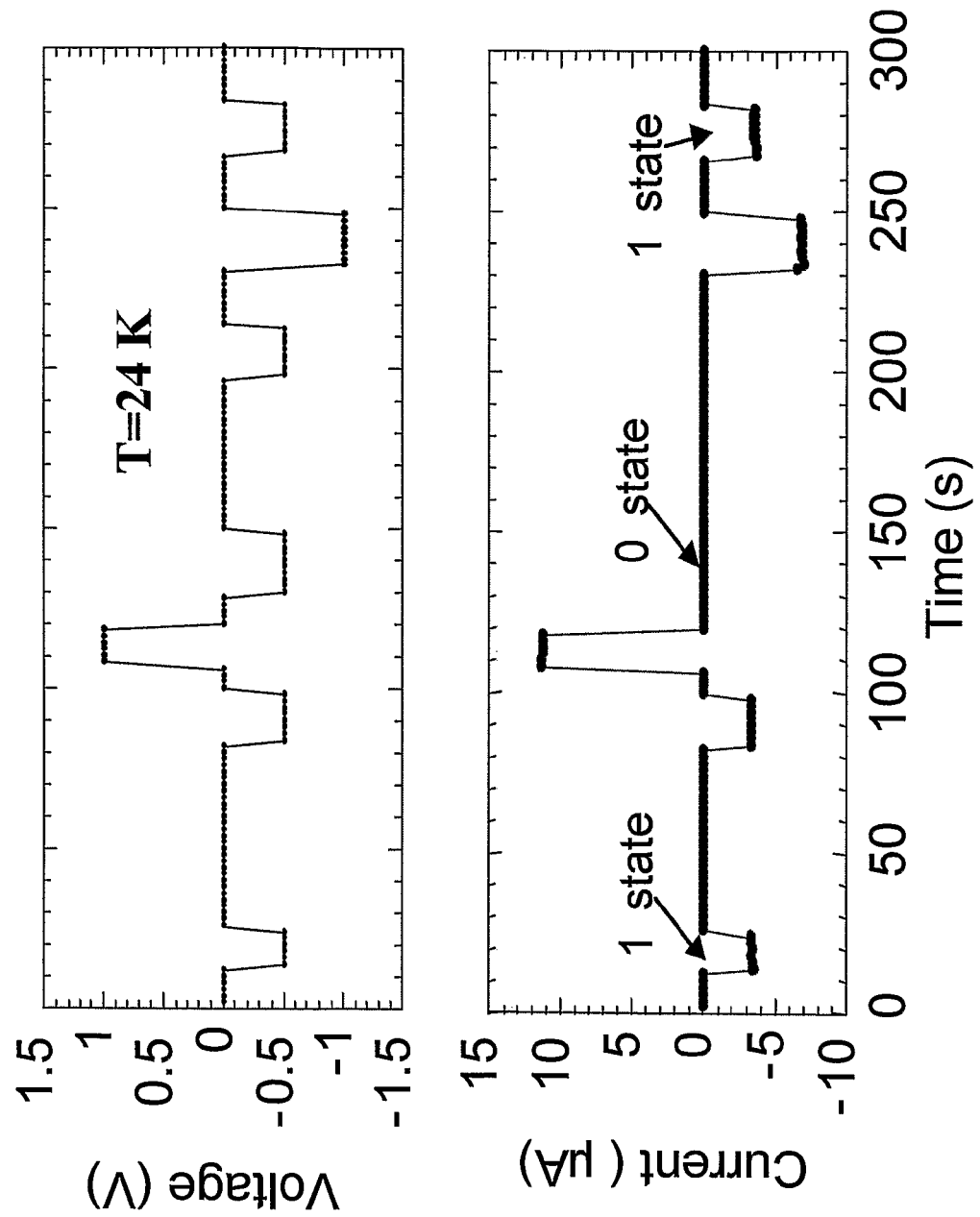
FIG. 4 shows two graphs, illustrating respectively the voltage applied to a memory unit, and the resulting current flow through the memory unit, as a function of time.

FIG. 4 illustrates the operation of the device illustrated with respect to FIG. 2, as a memory unit. The upper chart of FIG. 4 shows the potential difference applied across the first and second substrate surface areas 122, 124 via electrodes 152, 154, as a function of time. The lower chart illustrates the corresponding current flow between the areas, also as a function of time. As illustrated in FIG. 2, at −0.5V (volts), the current can be either 0 (e.g. memory state "0"), or about −2.5 µA (e.g. memory state "1"). An initial pulse of −0.5V at around 15 seconds was utilised to detect the initial memory state, with the non-zero current indicating that the memory unit was in memory state 1. A second pulse after approximately one minute still yielded a non-zero current, indicating that the memory unit maintained its memory state.

A positive pulse of 1V was then applied at around 110 seconds, so as to switch the memory unit from state 1 to state 0, with the subsequent test pulse of −0.5V verifying the device was in state 0 (by yielding zero current). A subsequent test voltage pulse (read voltage pulse) of −0.5V volts at around 200 seconds indicates that the device was held in memory state 0.

The device was then switched from memory state 0 to state 1 by applying a −1V pulse (at around 230 seconds), after which a non-zero current was produced when a subsequent −0.5V pulse was applied (at around 270 seconds).

It should be noted that the long time period switching pulses of +1V and −1V illustrated in FIG. 4 were utilised for clarity. Experimentation has indicated that the memory switching time of such memory units is below or at least of the order of µs.

The exact mechanism by which the self-switching memory unit described herein is completely different from that of a conventional semiconductor memory. To understand the memory effect, the following model is proposed, and described with respect to FIGS. 5A-5D.

Figure 5A:
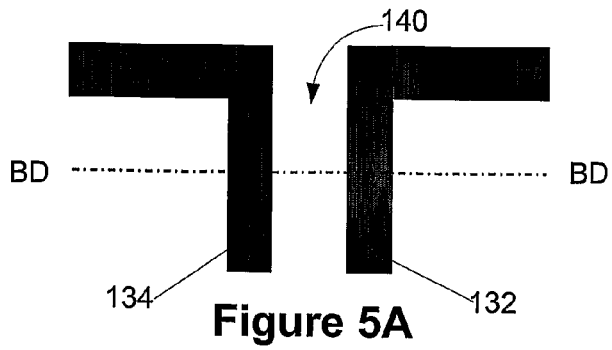
FIG. 5A is a schematic plan view of a memory unit.
Figure 5B:
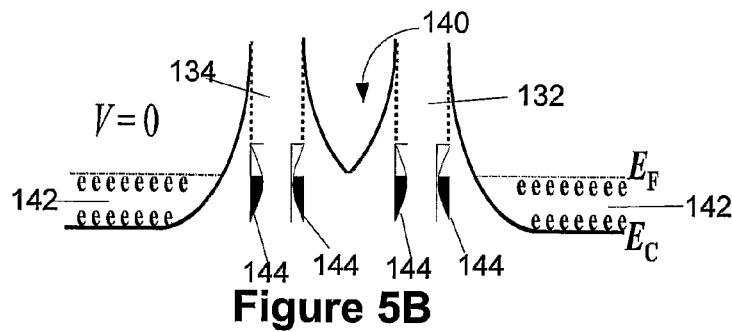
FIGS. 5B-5D illustrate the conduction-band profile along the dotted line of FIG. 5A, for different applied voltages to the memory unit.
Figure 5C:
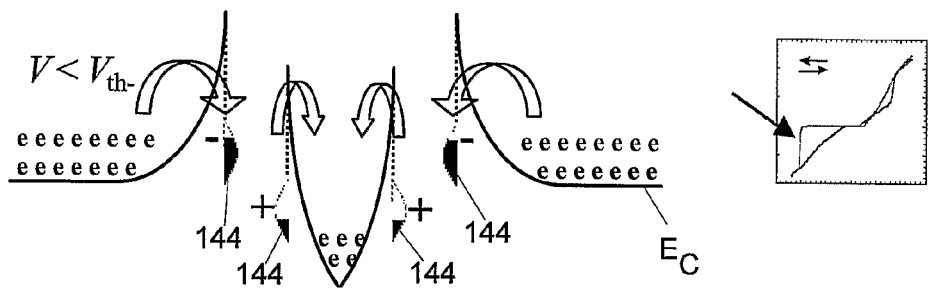
Figure 5D:
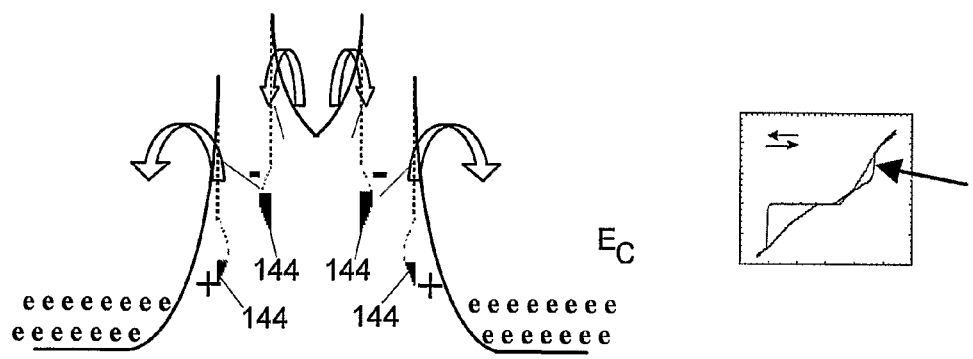

FIG. 5A illustrates a plan view of the channel 140 of a memory unit, as defined by the insulative features 132, 134. FIGS. 5B-5D illustrate the conduction-band profile along the dashed line BD in FIG. 5A over a range of different applied voltages. It should be noted that the vertical axis of FIGS. 5B-5D relate to the different energy levels within the memory unit, and not the physical position of the energy states within the memory unit.

FIG. 5B illustrates the conduction-band profile along the dashed line BD in FIG. 5A at zero bias. As is typical in III-V semiconductor materials, the conduction-band $E_C$ bends up close to the side walls of the etched trenches 132, 134, due to the charging of electrons into the surface states 144. The surface states are generally close to the middle of the band gap, with a narrow energy distribution. At zero bias (i.e. V=0), the surface states are in equilibrium with the 2DEG 142, and the Fermi energy ($E_F$) is below the conduction-band bottom in the channel 140, because the channel is completely depleted.

FIG. 5C illustrates the states when the applied bias is beyond the negative threshold voltage ($V_{th-}$), leading to the surface states being discharged by charge transfer into the channel 140. The small graph adjacent FIG. 5C is a small version of FIG. 2, with the large arrow indicating the relevant position on that graph to which FIG. 5C refers (i.e. at current breakdown).

When the applied bias is beyond the negative threshold voltage, the conduction-band in the channel 140 lowers so much that the surface states are significantly discharged by electron transfer into the channel 140, either by tunneling or thermal excitation (depending on the temperature and potential profile). This action is shown by the arrows in FIG. 5C. After the charge transfer has occurred, the side wall surface becomes less negative (or more positive) and this field effect enhances the overall conductance of the device, in agreement with the experimental result (solid line in FIG. 2).

Because of the potential barrier between the surface states and the channel 140, such charge transfer only becomes pronounced when the bias is beyond a certain threshold voltage to reduce the effective potential barrier width, as is shown in FIG. 5C. It should be noted, that even if the device is biased slightly below the threshold, a significant number of electrons can also be discharged after waiting for a long time, and the same effect should occur, which has been confirmed by experimentation.

FIG. 5D illustrates that the opposite process occurs if the applied bias is beyond the positive threshold voltage (+$V_{th}$). Once the side wall surfaces are discharged, a large positive bias induces the opposite charge transfer process, which explains how the device recovers after the application of a large positive voltage.

The above model qualitatively explains the experimental observations.

In the above embodiments, the memory device 100 has been described as comprising only a single memory unit 120. However, in most embodiments, it is envisaged that the memory device will comprise a plurality of memory units, with each memory unit being capable of being written to and read from. Preferably, the memory units are arranged in an array in such a memory device, comprising at least one column and at least one row of memory units.

Arranging the memory units in an array simplifies the addressing or scanning (reading from or writing to) of individual memory units within the array. Although the array is typically organised to comprise a plurality of rows and a plurality of columns, it will be appreciated that the actual geometrical position of each memory unit may not lie within a particular row or column. The term row or column simply indicates the organisation of the array. Thus, the terms row and column can be regarded as inter-changeable.

Figure 6:
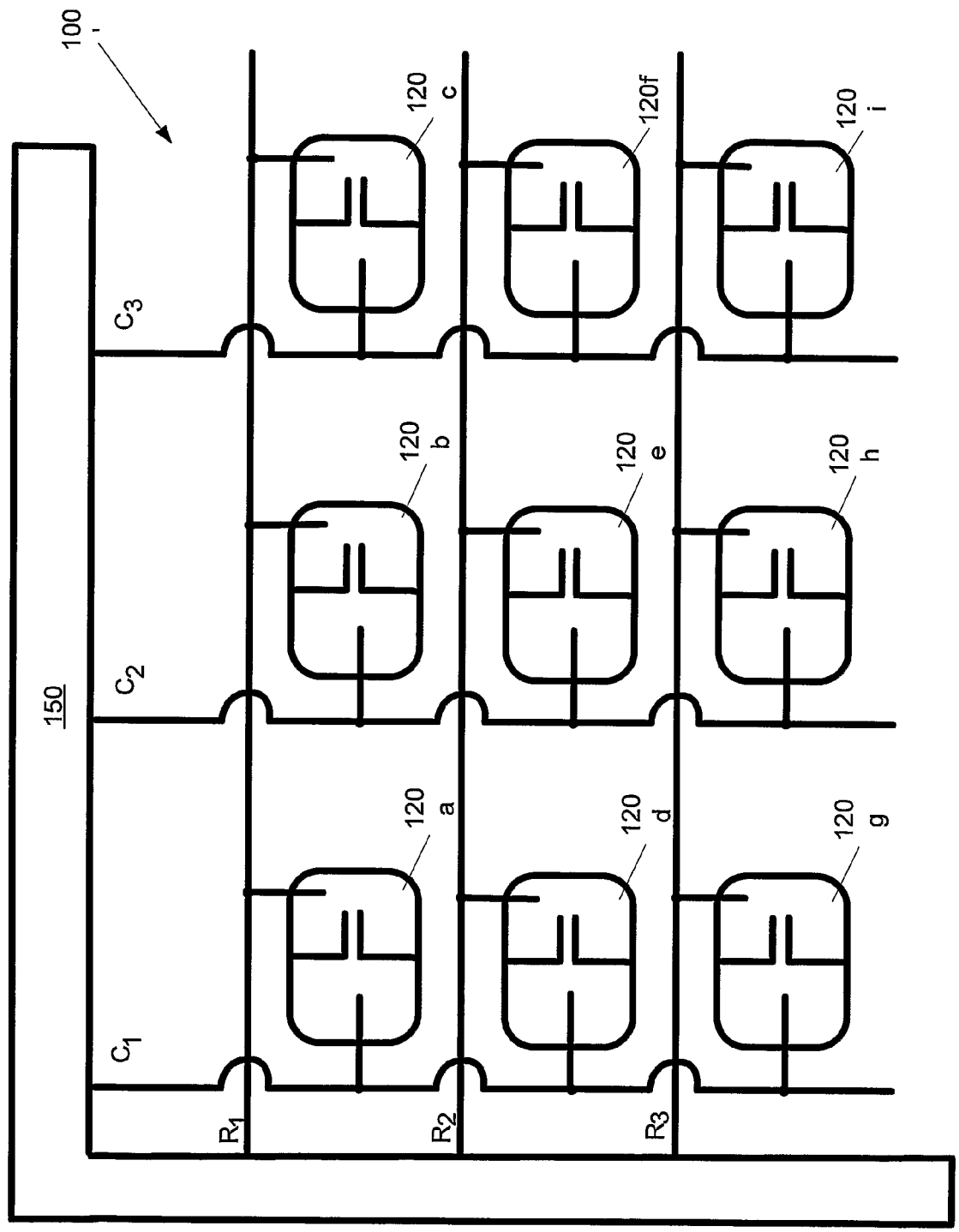
FIG. 6 is a schematic diagram of a memory incorporating an array of memory units in accordance with a further embodiment of the present invention.

FIG. 6 illustrates a memory device 100' comprising an array of nine memory units (120a-120i). Each of the memory units can be written to and read from via scanning circuit 150. The memory units are arranged in three rows (120a, 120b, 120c; 120d, 120e, 120f; 120g, 120h, 120i) and three columns (120a, 120d, 120g; 120b, 120e, 120h; 120c, 120f, 120i). All of the first electrodes of the memory units within each row are connected to a common column addressing line ($C_1$, $C_2$, $C_3$) i.e. a common electrical conductor. Similarly, all of the second electrodes of each memory unit within each row are connected to a respective common row addressing line ($R_1$, $R_2$, $R_3$). The column and row addressing lines are coupled to the scanning circuit 150, for providing the appropriate voltages to address the memory units.

As described earlier, different designs of memory unit or device can utilise different switching or threshold voltages to switch between the different states of each memory unit. Also as described earlier, it is the potential difference applied across the two areas of each memory unit (i.e. across the two electrodes of each memory unit) that is utilised to switch the states and read the states of each memory unit. In other words, the absolute value of the voltages is not significant.

Figure 7:
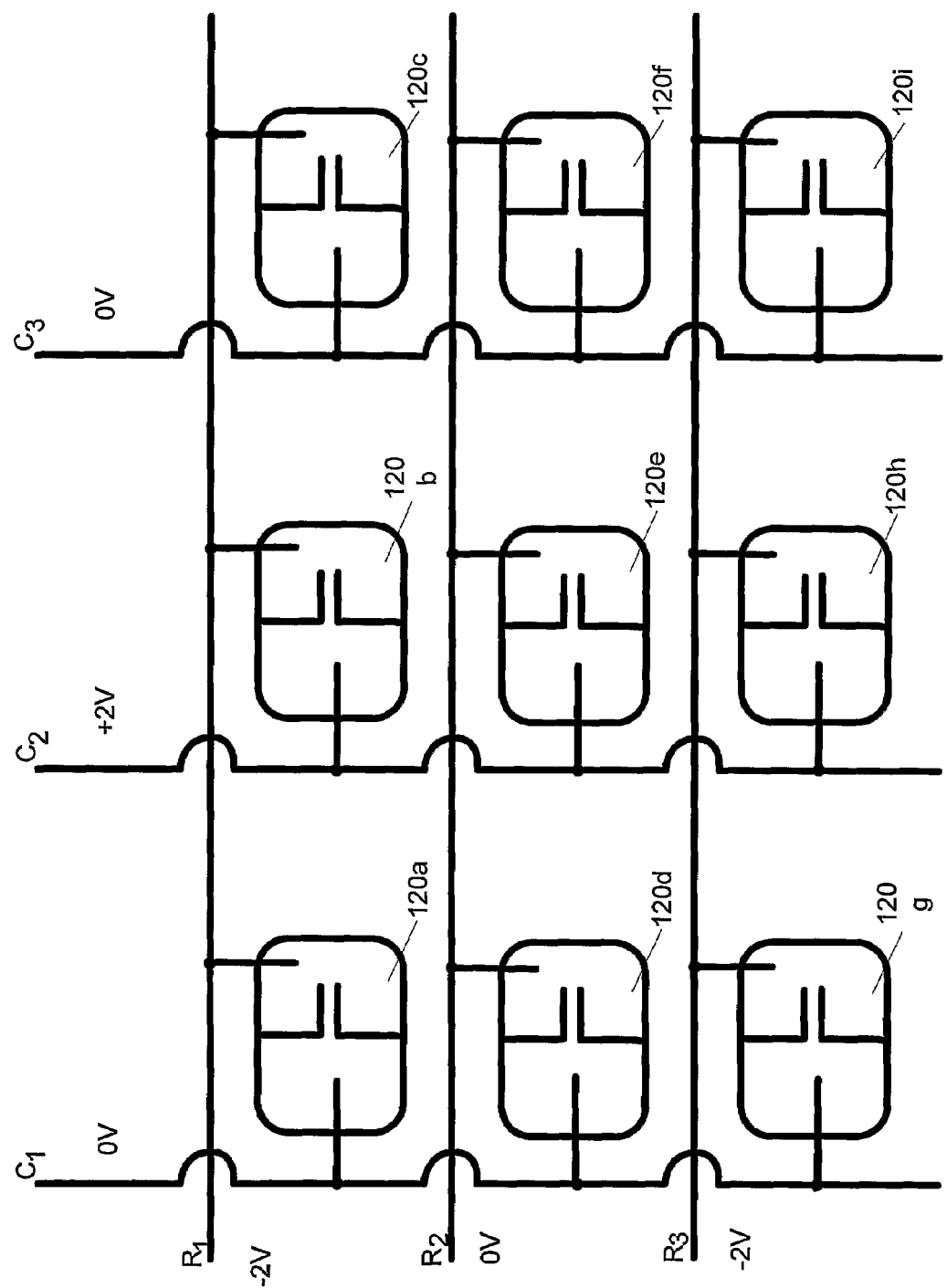
FIG. 7 is a schematic diagram of an array of memory units, illustrating voltages applied to the array during a write operation.
Figure 8:
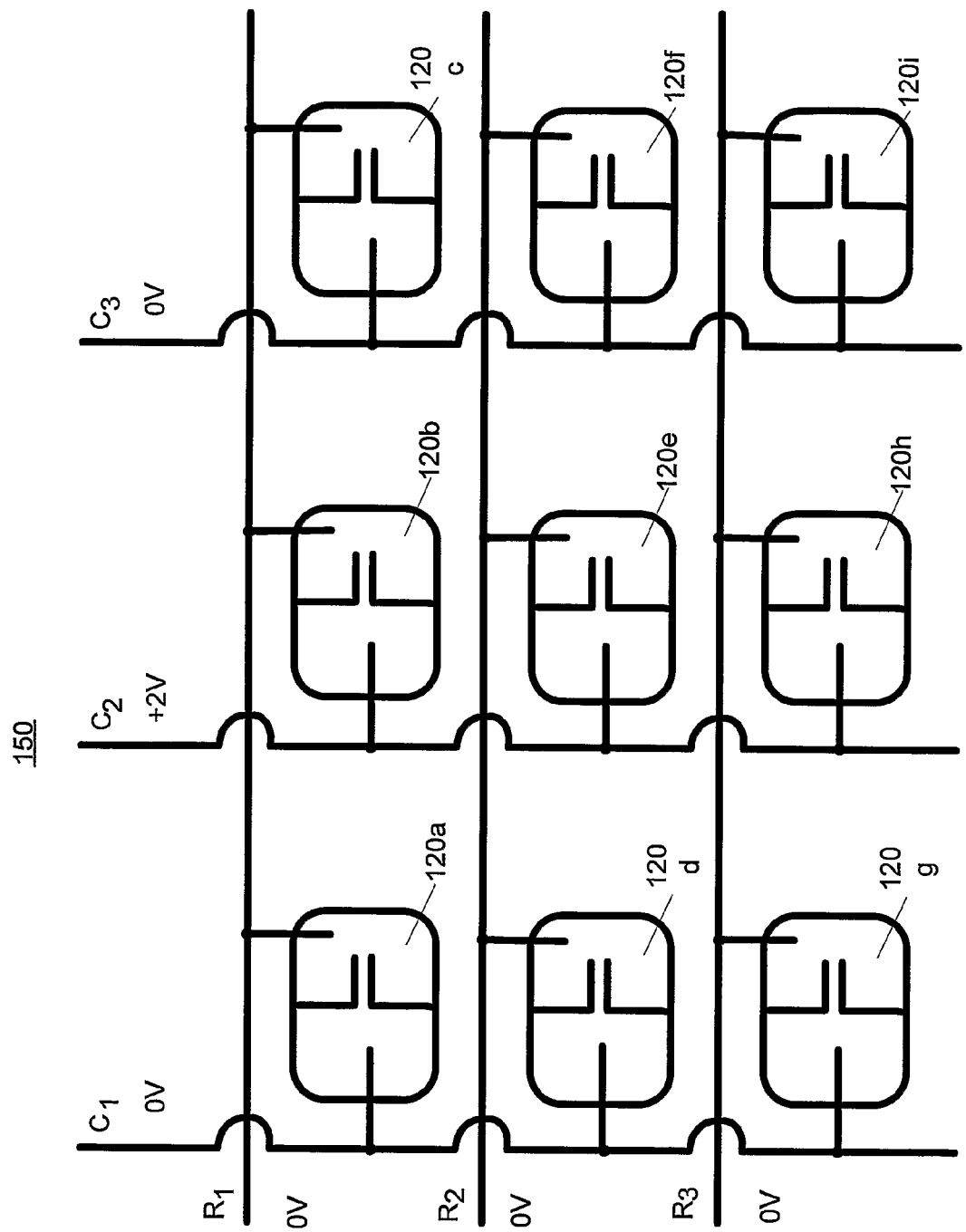
FIG. 8 is a schematic diagram of an array of memory units, illustrating voltages applied to the array during a read operation.

FIGS. 7 and 8 illustrate the array of memory units of the device 100' illustrated in FIG. 6, during respectively writing and reading operations. In the memory units illustrated in FIGS. 7 and 8, it is assumed that the negative threshold voltage (the potential difference required to switch from state 0 to state 1) is −4V, and the positive threshold voltage (required to switch from state 1 to state 0) is +4V. The read voltage (the potential difference applied to each memory unit, to detect the state of the memory in it) is selected as −2V.

FIG. 7 illustrates the operation of specific memory units (120b, 120h) within a column (C₂) being written to state 1, by applying a total voltage across the relevant memory units of −4V. Memory units can be written to on a column by column (or row by row basis). Due to the nature of operation of the memory units, it is preferable that only a single state writing operation is performed on each of the memory units in a column at any one time. For example, if it is desirable to change a predetermined number of memory units within a column to state 1, and the remainder of the memory units in the column to state 0, then the voltages should be applied to first change all of the relevant memory units to state 1, and then the subsequent voltages applied to change the remaining relevant memory units to state 0.

The voltages used to switch the memory units between states can be equal to the threshold voltages, or greater than the threshold voltages. Utilising larger switching voltages is likely to increase the switching speed.

Assuming that a predetermined number of memory units (120b, 120h) in a predetermined column (C₂) are being written to, then a predetermined portion of the total switching voltage is applied to the relevant column line. This predetermined portion is less than the threshold voltage (relative to the voltage applied to the columns/rows not being addressed e.g. in FIGS. 7 & 8, relative to 0V). The remaining portion of the switching voltage is then applied on a row by row basis, so as to divide the total switching voltage across each of the memory units that it is desired to write to. Again, the remaining portion of the switching voltage is less than the threshold voltage.

Thus, for example, FIG. 7 shows a +2V being applied to C2, and a −2V being applied to R1, so as to provide a total switching potential of −4V across memory unit 120b. This is sufficient to write memory unit 120b to state 1. Similarly, −2V is applied to R₃ so as to provide a total potential difference of −4V across 120h, to switch memory unit 120h to state 1. It will be observed that the remaining potential differences across each of the other memory units is less than the switching potential, such that those memories will remain in the same state.

FIG. 8 illustrates a read operation of a predetermined column (C2) of memory units. The read operation is achieved by applying the predetermined read voltage across each of the relevant memory units, and reading the current flow through each memory unit. The read voltage in the particular embodiment shown for FIG. 8 is −2V. Thus, to achieve −2V across each memory unit, in this embodiment, +2V is applied along C₂, and then 0V is applied across all of the relevant row lines. The state of memory unit 120b is then be read by measuring the current flow between C₂ and R₁, the state of memory unit 120e read by measuring the current flow between C₂ and R₂, etc.

It will be noted that other voltages can be applied to the relevant column/row lines, for the reading operation. For example, a voltage of +1V can be applied to C₂, and a voltage of −1V to each of the relevant row lines, so as to achieve the desired −2V read or sense voltage across each of the memory units 120b, 120c and 120h within column C₂. In other words a predetermined portion of the read voltage can be applied to the relevant column line, and a remaining portion of the voltage applied to each of the relevant row lines. By coupling appropriate current amplifiers between each of the rows and columns, it is possible to read out all of the states of each of the memory units in a particular column (or row) simultaneously.

The scanning circuit 150 in device 100' is also arranged to perform a refresh operation i.e. to read the state of the memory units in turn, and to write to the memory unit the state that is determined by the read operation.

As described herein, the present inventor has realised a novel memory unit, based upon a simple structure that can be readily manufactured. Further, the memory unit can be formed on a sub-micrometer (nanometre) scale, thus allowing miniaturisation of memory devices.

The invention claimed is:

1. A memory device comprising:
   at least one memory unit comprising a substrate supporting mobile charge carriers, insulative features formed on the substrate surface to define first and second substrate areas on either side of the insulative features, the first and second substrate areas being connected by an elongate channel defined by the insulative features, the memory unit being switchable between a first state in which the channel provides a first conductance between the first and second areas at a predetermined potential difference between said first and second areas, and a second state in which the channel provides a second, different conductance between the first and second areas at the predetermined potential difference;
   a write circuit arranged to apply a first potential difference across the first and second areas of said memory unit, for changing the memory unit to the first state, and a second, different potential difference for changing the memory unit to the second state; and
   a read circuit arranged to apply the predetermined potential difference across the first and second areas of said memory unit, for reading the state of the memory unit.

2. The memory device as claimed in claim 1, wherein the predetermined potential difference is greater than one of the first and second potential differences, and less than the other.

3. The memory device as claimed in claim 1, wherein the second potential difference has the same magnitude, but is of the opposite polarity, to the first potential difference.

4. The memory device as claimed in claim 1, wherein the read circuit comprises a current sensor for measuring the current flow between the first and second areas of said memory unit.

5. The memory device as claimed in claim 1, wherein the device comprises a refresh circuit arranged to determine the state of said memory unit by applying the predetermined potential difference across the first and second areas of said memory unit, and arranged to subsequently apply the first potential difference if said memory unit is determined as being in the first state, and the second potential difference if the memory unit is determined as being in the second state.

6. The memory device as claimed in claim 1, wherein the memory unit is a self-switching diode.

7. The memory device as claimed in claim 1, wherein the device comprises a plurality of said memory units.

8. The memory device as claimed in claim 7, wherein the read circuit is arranged to apply the predetermined potential difference across the respective first and second areas of a plurality of said memory units, for reading the state of more than one memory unit simultaneously.

9. The memory device as claimed in claim 7, wherein the plurality of memory units are arranged in a plurality of rows and a plurality of columns to form a memory array, with a first area of each memory unit being connected to a respective row line and second area of each memory unit being connected to a respective column line;

the write circuit being arranged to apply a first voltage to the relevant column line and a second voltage to the relevant row line so as to provide at least one of said first potential difference and said second potential difference, which first and second voltages are insufficient to alter the state of the remaining memory units in the array.

10. The memory device as claimed in claim 9, wherein the read circuit is arranged to apply a sense voltage to one of the column lines, to apply a different, fixed voltage to the remaining column lines and to read the state of at least one memory unit using a current sense amplifier connected to the row line connected to that memory unit.

11. The memory device as claimed in claim 1, wherein said at least one memory unit is arranged for removable connection to the write circuit and the read circuit.

12. A method of manufacturing a memory device, the method comprising:

providing at least one memory unit comprising a substrate supporting mobile charge carriers, insulative features formed on the substrate surface to define first and second substrate areas on either side of the insulative features, the first and second substrate areas being connected by an elongate channel defined by the insulative features, the memory unit being switchable between a first state in which the channel provides a first conductance between the first and second areas at a predetermined potential difference between said first and second areas, and a second state in which the channel provides a second, different conductance between the first and second areas at the predetermined potential difference;

providing a write circuit arranged to apply a first potential difference across the first and second areas of said memory unit, for changing the memory unit to the first state, and a second, different potential difference for changing the memory unit to the second state; and providing a read circuit arranged to apply the predetermined potential difference across the first and second areas of said memory unit, for reading the state of the memory unit.

13. A method of writing to a memory unit, the memory unit comprising:

a substrate supporting mobile charge carriers, insulative features formed on the substrate surface to define first and second substrate areas on either side of the insulative features, the first and second substrate areas being connected by an elongate channel defined by the insulative features, the memory unit being switchable between a first state in which the channel provides a first conductance between the first and second areas at a predetermined potential difference between said first and second areas, and a second state in which the channel provides a second, different conductance between the first and second areas at the predetermined potential difference;

the method of writing comprising at least one of:

applying a first potential difference between the first and second areas of the memory unit, for changing the memory unit to the first state; and applying a second, different potential difference across the first and second areas of the memory unit, for changing the memory unit to the second state.

14. A method of reading a memory unit, the memory unit comprising:

a substrate supporting mobile charge carriers, insulative features formed on the substrate surface to define first and second substrate areas on either side of the insulative features, the first and second substrate areas being connected by an elongate channel defined by the insulative features, the memory unit being switchable between a first state in which the channel provides a first conductance between the first and second areas at a predetermined potential difference between said first and second areas, and a second state in which the channel provides a second, different conductance between the first and second areas at the predetermined potential difference;

the method of reading comprising:

applying the predetermined potential difference across the first and second areas; and reading the state of the memory unit.

15. The method as claimed in claim 14, wherein the state of the memory unit is read by measuring a signal indicative of the current flow between the first and second areas of the memory unit.

16. A scanning device comprising:

a voltage source, and electrodes for applying a potential difference between first and second areas of a memory unit, the scanning device being arranged to perform a method of reading a memory unit, the memory unit comprising:

a substrate supporting mobile charge carriers, insulative features formed on the substrate surface to define first and second substrate areas on either side of the insulative features, the first and second substrate areas being connected by an elongate channel defined by the insulative features, the memory unit being switchable between a first state in which the channel provides a first conductance between the first and second areas at a predetermined potential difference between said first and second areas, and a second state in which the channel provides a second, different conductance between the first and second areas at the predetermined potential difference;

the method of reading comprising:

applying the predetermined potential difference across the first and second areas; and reading the state of the memory unit.

* * * * *